(12) United States Patent
Jan et al.

(10) Patent No.: US 10,573,776 B2
(45) Date of Patent: Feb. 25, 2020

(54) MANUFACTURING METHOD OF IMAGE-SENSING MODULE

(71) Applicant: LUXVISIONS INNOVATION LIMITED, Hong Kong (HK)

(72) Inventors: Shin-Dar Jan, Hong Kong (HK); Po-Chih Hsu, Hong Kong (HK)

(73) Assignee: LUXVISIONS INNOVATION LIMITED, Hong Kong (HK)

( * ) Notice: Subject to any disclaimer, the term of this patent is extended or adjusted under 35 U.S.C. 154(b) by 0 days.

(21) Appl. No.: 16/114,243

(22) Filed: Aug. 28, 2018

(65) Prior Publication Data

US 2019/0067363 A1 Feb. 28, 2019

Related U.S. Application Data

(60) Provisional application No. 62/551,203, filed on Aug. 28, 2017.

(51) Int. Cl.
*H01L 31/18* (2006.01)
*H01L 31/0203* (2014.01)
*H01L 31/02* (2006.01)
*H01L 31/0232* (2014.01)
*H01L 27/146* (2006.01)
*H04N 5/225* (2006.01)

(52) U.S. Cl.
CPC .......... *H01L 31/18* (2013.01); *H01L 27/1469* (2013.01); *H01L 27/14685* (2013.01); *H01L 31/02002* (2013.01); *H01L 31/0203* (2013.01); *H01L 31/02325* (2013.01); *H04N 5/2254* (2013.01)

(58) Field of Classification Search
CPC .......... H01L 27/1462; H01L 27/14627; H01L 27/14629; H01L 27/14685; H01L 27/1469; H01L 31/02002; H01L 31/0203; H01L 31/02325; H01L 31/0543; H01L 31/18; H01L 31/1842
See application file for complete search history.

(56) References Cited

U.S. PATENT DOCUMENTS

| | | | | |
|---|---|---|---|---|
| 9,722,098 B1 * | 8/2017 | Chung | ............... | H01L 31/0203 |
| 2009/0215216 A1 * | 8/2009 | Huang | ............. | H01L 27/14618 438/65 |
| 2009/0256222 A1 * | 10/2009 | Hsu | .................. | H01L 27/14618 257/432 |
| 2016/0021282 A1 * | 1/2016 | Peng | .................... | H04N 5/2252 348/373 |

* cited by examiner

*Primary Examiner* — Stephen W Smoot
(74) *Attorney, Agent, or Firm* — JCIPRNET

(57) ABSTRACT

A manufacturing method of an image-sensing module includes following steps. A substrate is provided. At least one photosensitive chip is disposed on the substrate, and each of the at least one photosensitive chip has an active area. At least one protection layer covers the at least one active area of the at least one photosensitive chip. A first manufacturing process is performed, and dust is generated during the first manufacturing process. The at least one protection layer is suitable for isolating the dust from the at least one active area. The at least one protection layer is removed to expose the at least one active area.

10 Claims, 4 Drawing Sheets

MANUFACTURING METHOD OF IMAGE-SENSING MODULE

CROSS-REFERENCE TO RELATED APPLICATION

This application claims the priority benefit of U.S. provisional application Ser. No. 62/551,203, filed on Aug. 28, 2017. The entirety of the above-mentioned patent application is hereby incorporated by reference herein and made a part of this specification.

BACKGROUND

Technical Field

The disclosure relates to a manufacturing method; more particularly, the disclosure relates to a manufacturing method of an image-sensing module.

Description of Related Art

In recent years, to comply with the full screen requirements of electronic products, the design of an image-sensing module has become light, thin, short and small. As such, manufacturers are required to develop new manufacturing processes to form an image-sensing module of the required size. During the new manufacturing processes, a significant amount of dust may be generated, which may contaminate the image-sensing module. At present, it is common to perform a cleaning process with use of water after the dust contamination.

However, the above-mentioned rinsing method may not completely remove the dust, and large dust particles easily cause abrasions or scratches to the devices in the image-sensing module, thereby posing a negative impact on the subsequent manufacturing processes. Therefore, how to prevent dust damages to the image-sensing module is what those skilled in the art should strive for.

SUMMARY

The disclosure provides a manufacturing method of an image-sensing module, whereby dust may be isolated by a protection layer, and the manufacturing process may be smoothly carried out.

In an embodiment of the invention, a manufacturing method of an image-sensing module includes following steps. A substrate is provided. At least one photosensitive chip is disposed on the substrate, and each of the at least one photosensitive chip has an active area. The at least one active area of the at least one photosensitive chip is covered by at least one protection layer. A first manufacturing process is performed, and during the first manufacturing process, the at least one protection layer covers the at least one active area. The at least one protection layer is removed to expose the at least one active area.

In an embodiment of the invention, the first manufacturing process includes: disposing a plurality of conductive wires between the at least one photosensitive chip and the substrate to electrically connect the at least one photosensitive chip and the substrate.

In an embodiment of the invention, the manufacturing method of the image-sensing module further includes: performing a second manufacturing process, wherein the at least one protection layer covers the at least one active area during the second manufacturing process, and the second manufacturing process includes: cleaning a surface of the substrate with use of plasma.

In an embodiment of the invention, the manufacturing method of the image-sensing module further includes: performing a third manufacturing process, wherein the at least one protection layer covers the at least one active area during the third manufacturing process, and the third manufacturing process includes: forming a package layer on the substrate, wherein the package layer encapsulates a portion of the at least one photosensitive chip and exposes whole of the at least one protection layer.

In an embodiment of the invention, the number of the at least one photosensitive chip is plural. After the step of forming the package layer on the substrate, the package layer and the substrate are cut to form a plurality of photosensitive assemblies, and during the step of cutting the package layer and the substrate, the at least one protection layer covers the at least one active area.

In an embodiment of the invention, the manufacturing method of the image-sensing module further includes: arranging a lens assembly on the package layer after the step of removing the at least one protection layer, and the lens assembly corresponds to the active area.

In an embodiment of the invention, the manufacturing method of the image-sensing module further includes: performing a cleaning process after the step of removing the at least one protection layer.

In an embodiment of the invention, the first manufacturing process includes one of a step of disposing a plurality of conductive wires between the at least one photosensitive chip and the substrate, a step of cleaning a surface of the substrate with use of plasma, and a step of forming a package layer on the substrate.

In an embodiment of the invention, the manufacturing method of the image-sensing module further includes: arranging a mirror holder on the substrate after the step of removing the at least one protection layer, wherein the mirror holder exposes the active area.

In an embodiment of the invention, the manufacturing method of the image-sensing module further includes: arranging a lens assembly on the mirror holder, the lens assembly corresponding to the active area.

In an embodiment of the invention, the manufacturing method of the image-sensing module further includes: adhering a plurality of passive devices to a surface of the substrate before the step of covering the at least one active area with the at least one protection layer.

In view of the above, according to the manufacturing method of the image-sensing module provided in the disclosure, the protection layer disposed in the active area of the photosensitive chip is applied to isolate the dust generated during the manufacturing process and prevent contamination from the outside. Since the active area of the photosensitive chip is covered, the active area is not subject to dust and contamination and thus may not be hit or scratched. After the manufacturing process is completed, the protection layer is removed to expose the active area. Thereby, the entire process of manufacturing the image-sensing module may be carried out smoothly, and the manufacturing yield may be improved.

In order to make the above features provided in the disclosure more comprehensible, the following embodiments are described in detail below with reference to the accompanying drawings.

DESCRIPTION OF THE EMBODIMENTS

FIG. 1A to FIG. 1F are schematic views illustrating steps of a manufacturing method of an image-sensing module according to an embodiment of the invention. In this embodiment, the image-sensing module 100 may serve, for instance, as an image-sensing module of a camera in a mobile phone, and the application of the image-sensing module 100 is not limited to what is disclosed herein. A manufacturing method of the image-sensing module 100 provided in the present embodiment includes following steps.

Figure 1A:
FIG. 1A to FIG. 1F are schematic views illustrating steps of a manufacturing method of an image-sensing module according to an embodiment of the invention.
Figure 1B:
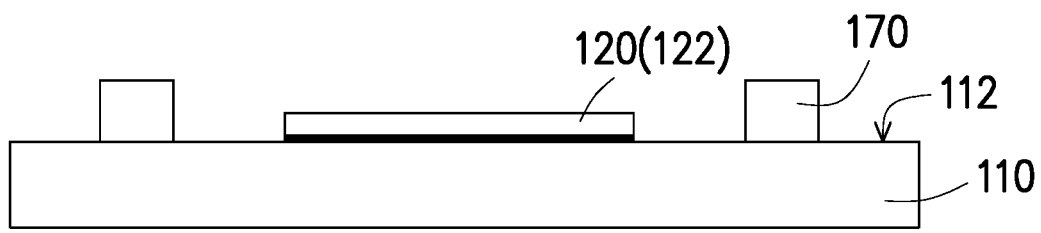

First, a substrate 110 shown in FIG. 1A is provided. The substrate 110 is, for instance, a circuit board and has a surface 112. In this embodiment, a plurality of passive devices 170 are provided on the substrate 110. The passive devices 170 are, for instance, capacitors, resistors, or inductors, and the passive devices 170 are adhered and fixed to the surface 112 of the substrate 110 through applying a surface mount technology (SMT). With reference to FIG. 1B, at least one photosensitive chip 120 is disposed on the substrate 110, and the photosensitive chip 120 may be a complementary metal oxide semiconductor (CMOS) or a charge coupled device (CCD). The photosensitive chip 120 has an active area 122 which is, for instance, located on one side away from the substrate 110. The active area 122 is an exposed region on the surface of the photosensitive chip 120 for receiving light or sensing the intensity of the light. It should be mentioned that the photosensitive chip 120 provided in the present embodiment is fixed to the surface 112 of the substrate 110 through adhesive bonding, and the adhesive is dried by performing a curing process (e.g., heating, ultraviolet curing, and so on), so as to fix the photosensitive chip 120 to the substrate 110, which should however not be construed as a limitation in the disclosure. The photosensitive chip 120 may also be latched to the substrate 110 or fixed to the substrate 110 by other means.

Figure 1C:
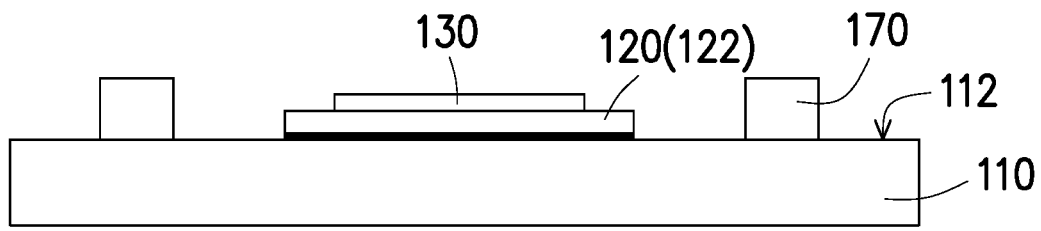

With reference to FIG. 1C, the at least one active area 122 of the at least one photosensitive chip 120 is covered by at least one protection layer 130 to prevent dust or dirt from falling onto the active area 122. In the present embodiment, a material of the protection layer 130 includes but is not limited to epoxy resin. The protection layer 130 may be a tape or a cover. For instance, the tape is a gel adhesive, silica gel, or another release adhesive. The cover is, for instance, a glass cover whose density is greater than the density of plastic, so that the weight per unit volume is greater. Therefore, the glass cover covering the active area 122 may be fixed by its own weight and does not easily slide. In other embodiments, the cover may be equipped with a simple positioning structure and thus does not move easily. Certainly, the material of the protection layer 130 is not limited thereto.

Figure 1D:
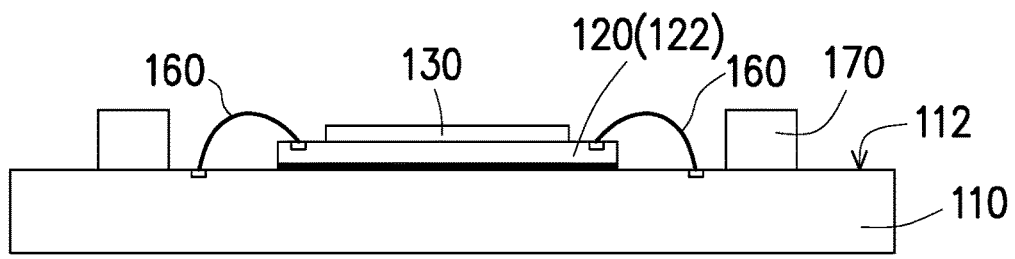

With reference to FIG. 1D, after the step of covering the active area 122 of the photosensitive chip 120 with the protection layer 130, a first manufacturing process is performed. In the present embodiment, the first manufacturing process is to dispose a plurality of conductive wires 160 between the photosensitive chip 120 and the substrate 110 to electrically connect the photosensitive chip 120 and the substrate 110. In other embodiments, note that the image-sensing module 100 may also be formed by applying a flip-chip technology. The photosensitive chip 12 may be placed on the substrate 110, and the step of placing the conductive wires 160 between the photosensitive chip 120 and the substrate 110 is omitted. The invention is not limited to the embodiments set forth herein.

During the step of disposing the conductive wires 160, dust is generated, and the protection layer 130 covering the active area 122 allows the dust to be isolated from the active area 122. After the first manufacturing process is completed, a second manufacturing process is performed. In the present embodiment, the second manufacturing process is to clean the surface 112 of the substrate 110 by plasma, so that the surface 112 of the substrate 110 becomes clean and may then be activated. During the second manufacturing process, the protection layer 130 is still covering the active area 122, and therefore the active area 122 is not affected by the plasma cleaning step.

Figure 1E:
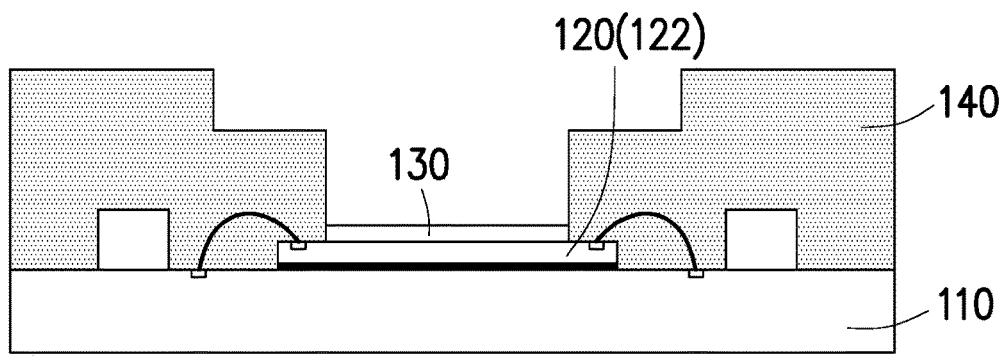

With reference to FIG. 1E, after the step of performing the second manufacturing process, a third manufacturing process is performed. In this embodiment, the third manufacturing process is to form a package layer 140 on the substrate 110. The package layer 140 encapsulates the conductive wires 160, the passive devices 170, and a portion of the photosensitive chip 120, and the package layer 140 exposes the entire protection layer 130. In this embodiment, FIG. 1E schematically depicts one photosensitive chip 120 in a side view. In a top view or views at other view angles, the photosensitive 120 may refer to a plurality of photosensitive chips 120. After the step of forming the package layer 140 on the substrate 110, a step of cutting the package layer 140 and the substrate 110 is performed, and the photosensitive chips 120 are singulated to form a plurality of photosensitive assemblies. During the step of cutting the package layer 140 and the substrate 110, the protection layer 130 covers the active areas 122 of the photosensitive chips 120.

Therefore, during the first manufacturing process, the second manufacturing process, the third manufacturing process, and the cutting step, the active area 122 of the photosensitive chip 120 is covered by the protection layer 130, and thus the significant amount of dust or dirt generated in these processes is not in contact with the active area 122 of the photosensitive chip 120, and the active area 122 of the photosensitive chip 120 remains clean. Certainly, the number and type of manufacturing processes are not limited to those provided above, and the protection layer 130 may be applied to cover the active area 122 of the photosensitive chip 120 at any time when a manufacturing process that may lead to the dust contamination is performed.

Figure 1F:
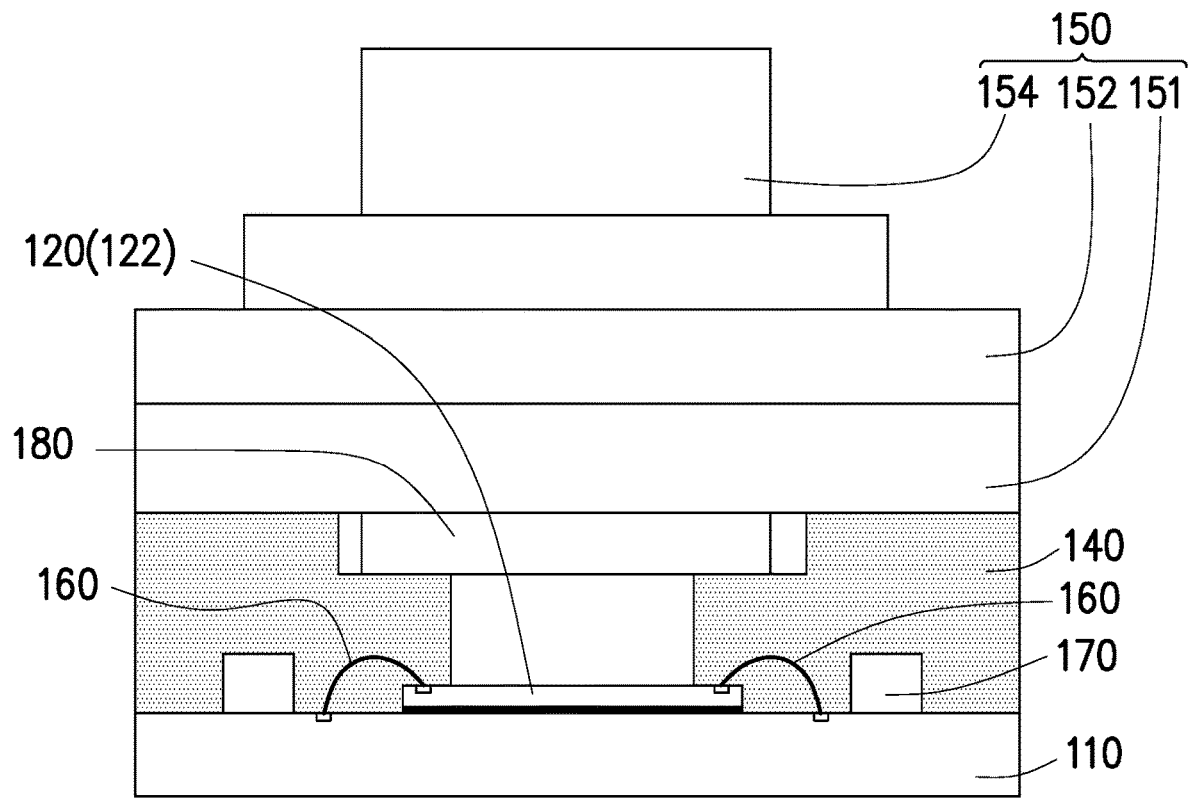

With reference to FIG. 1F, after the step of forming the package layer 140 on the substrate 110 and the cutting step are performed, the protection layer 130 disposed on the active area 122 is removed to expose the active area 122. Since a significant amount of dust or dirt is accumulated on the substrate 110 during the first manufacturing process, the second manufacturing process, and the third manufacturing process, a cleaning process may be performed on the region of the substrate 110 that is not covered by the protection layer 130 before or after the step of removing the protection layer 130, so as to completely remove the dust generated in the manufacturing processes. This is conducive to carrying out subsequent manufacturing processes.

Figure 1G:
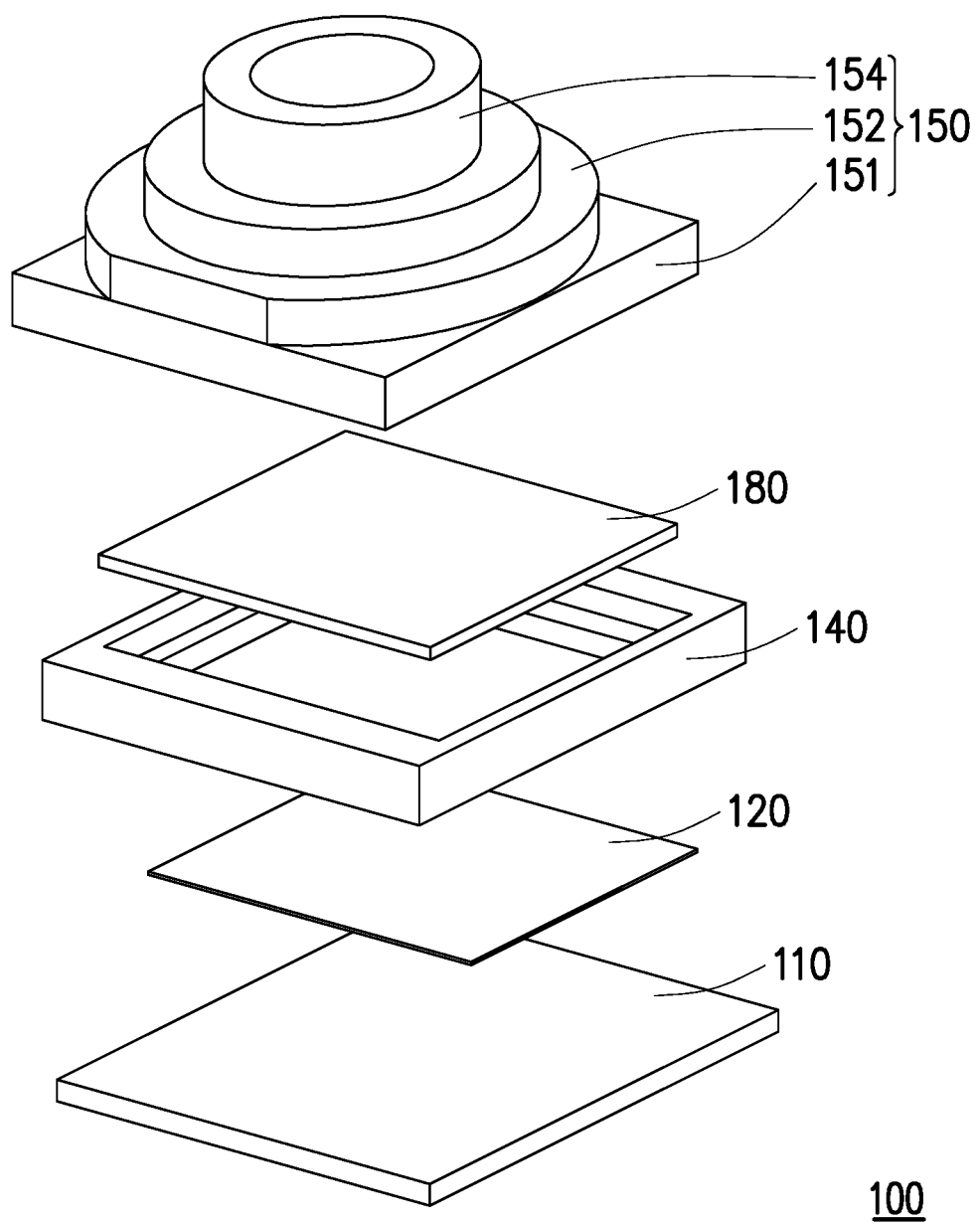
FIG. 1G is a schematic three-dimensional exploded view illustrating the image-sensing module depicted in FIG. 1F.

With reference to FIG. 1F, after the step of removing the protection layer 130, a transparent plate 180 is disposed above the photosensitive chip 120 to complete the manufacture of the image-sensing module 100 provided in the present embodiment. FIG. 1G is a schematic three-dimensional exploded view illustrating the image-sensing module depicted in FIG. 1F. In order to make the illustration simple and easy to understand, note that FIG. 1G only schematically shows some of the devices provided in the disclosure. As shown in FIG. 1G, in the present embodiment, a lens assembly 150 may be arranged on the package layer 140, and the lens assembly 150 corresponds to the active area 122. The lens assembly 150 includes a bracket 151 that supports devices to be subsequently installed, such as a voice coil motor 152, a lens barrel 154 (Lens Barrel), and so on.

It is worth mentioning that since the lens assembly 150 provided in this embodiment is installed on the package layer 140 (i.e., above the passive devices 170), the lens assembly 150 does not occupy the space on the substrate 110. Therefore, the width of the image-sensing module 100 provided in this embodiment may be further reduced, which contributes to the compliance with the full screen requirement. In addition, the transparent plate 180 is, for instance, a filter film or a filter lens, e.g., Blue Glass, and a voice coil motor 152, a lens barrel 154, or the like may be mounted on the bracket 151 of the lens assembly 150. Here, the voice coil motor 152 may be configured to move the lenses for adjusting the focal length, while the type of the transparent plate 180 and the types of parts mounted on the lens assembly 150 are not limited in the disclosure.

Figure 2A:
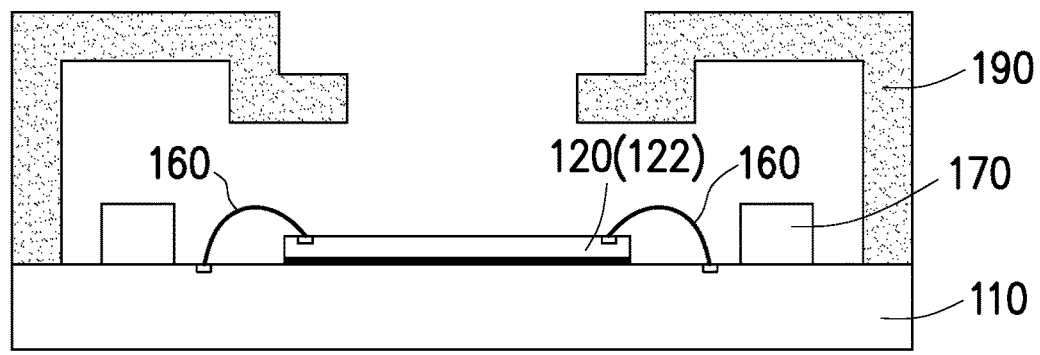
FIG. 2A and FIG. 2B are schematic views illustrating steps of a manufacturing method of an image-sensing module according to another embodiment of the invention.
Figure 2B:
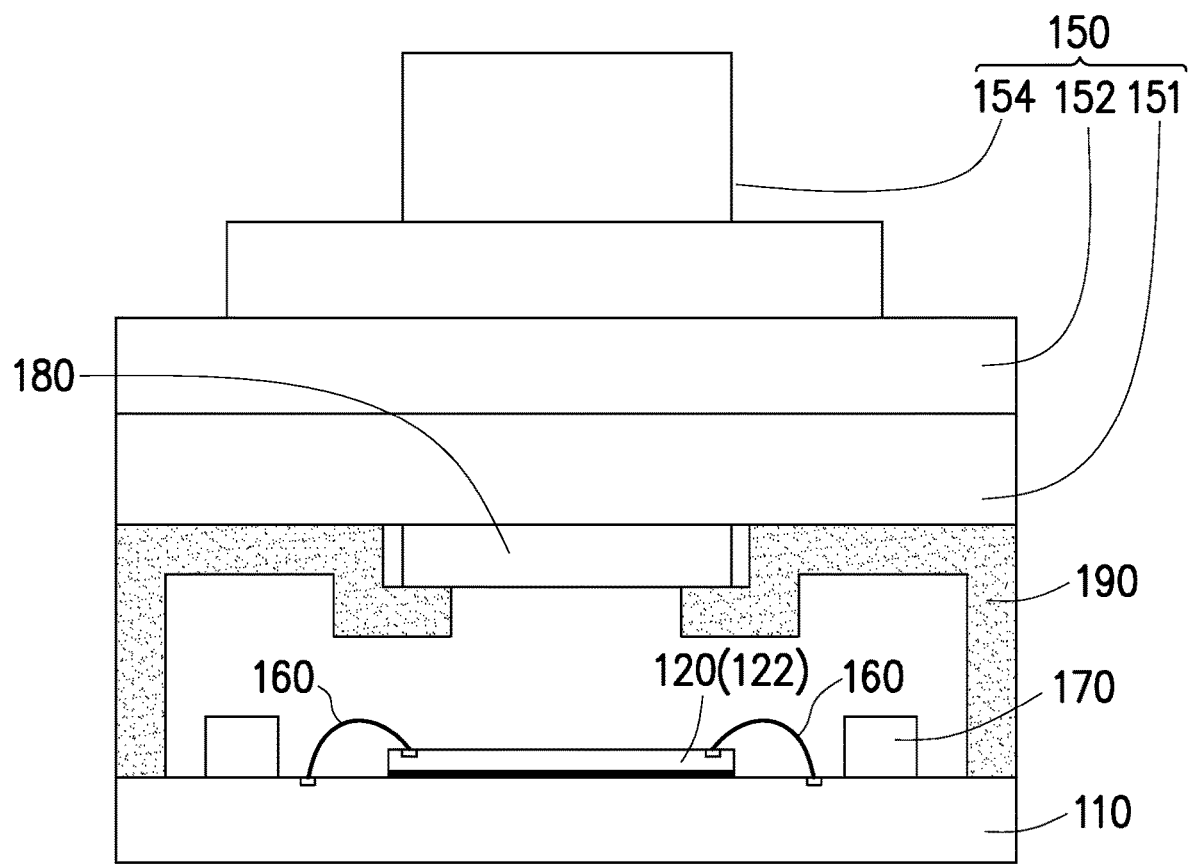

FIG. 2A and FIG. 2B are schematic views illustrating steps of a manufacturing method of an image-sensing module according to another embodiment of the invention. In this embodiment, the manufacturing method of the image-sensing module 200 is similar to the manufacturing method of the image-sensing module 100 provided in the previous embodiment and shown in FIG. 1A to FIG. 1D. Therefore, the reference numbers and some descriptions provided in the previous embodiments are also used in the present embodiment. Here, the same reference numbers are applied to represent the same or similar devices, and the description of the same technical content is omitted. The omitted descriptions and steps may be deduced from the previous embodiments and thus will not be further explained in the present embodiment. The differences between the steps described in the previous embodiment and those provided in the present embodiment will be elaborated hereinafter.

With reference to FIG. 2A, after the step of disposing the conductive wires 160 between the substrate 110 and the photosensitive chip 120 and the step of cleaning the surface 112 of the substrate 110 with use of plasma (i.e., after the step shown in FIG. 1D) are performed, the manufacturing method of the image-sensing module 200 provided in the present embodiment does not include the formation of the package layer 140 of the image-sensing module 100 as provided in the previous embodiment nor the step of cutting the substrate 110 and the package layer 140; instead, in the present embodiment, the manufacturing method of the image-sensing module 200 includes a step of directly removing the protection layer 130 to expose the active area 122 of the photosensitive chip 120. After that, the region of the substrate 110 that is not covered by the protection layer 130 is cleaned, and the dust generated in the step of disposing the conductive wires 160 between the substrate 110 and the photosensitive chip 120 and the step of cleaning the surface 112 of the substrate 110 with use of plasma is cleaned, so as to ensure the cleanness of a region of the substrate 110 where the mirror holder 190 is installed and ensure the subsequent installation process to be performed smoothly. After the step of removing the protection layer 130 as shown in FIG. 2A, the mirror holder 190 is placed on the substrate 110, and the mirror holder 190 exposes the active area 122 of the photosensitive chip 120. A transparent plate 180 is then disposed on the mirror holder 190, and the lens assembly 150 corresponding to the active area 122 is disposed on the mirror holder 190, so as to complete the manufacture of the image-sensing module 200 shown in FIG. 2B.

To sum up, according to the manufacturing method of the image-sensing module provided in one or more embodiments of the invention, the protection layer covering the active area is configured to prevent the dust generated in the manufacturing processes from falling onto the active area of the photosensitive chip. As such, the active area may be protected from scratches or damages caused by the impact of dust, and the manufacturing yield may be improved. In addition, when the protection layer is removed from the active area, no residual adhesive is left, so that the active area remains clean. Moreover, the arrangement of the lens assembly on the package layer is conducive to the improvement of the utilization rate of the space on the substrate and the reduction of the overall size of the image-sensing module, thereby contributing to the compliance with the fill screen requirement on the market.

It will be apparent to those skilled in the art that various modifications and variations can be made to the structure provided herein without departing from the scope or spirit of the invention. In view of the foregoing, it is intended that the disclosure provide modifications and variations provided they fall within the scope of the following claims and their equivalents.

What is claimed is:

1. A manufacturing method of an image-sensing module, comprising:
providing a substrate;
placing at least one photosensitive chip on the substrate, each of the at least one photosensitive chip having at least one active area;
covering the at least one active area of the at least one photosensitive chip with at least one protection layer;
performing a first manufacturing process, wherein the at least one protection layer covers the at least one active area during the first manufacturing process; and
removing the at least one protection layer to expose the at least one active area,
wherein the first manufacturing process comprises disposing a plurality of conductive wires between the at least one photosensitive chip and the substrate to electrically connect the at least one photosensitive chip and the substrate.

2. The manufacturing method as recited in claim 1, further comprising: performing a second manufacturing process, wherein the at least one protection layer covers the at least one active area during the second manufacturing process, and the second manufacturing process comprises: cleaning a surface of the substrate with use of plasma.

3. The manufacturing method as recited in claim 1, further comprising: performing a third manufacturing process, wherein the at least one protection layer covers the at least one active area during the third manufacturing process, and the third manufacturing process comprises: forming a package layer on the substrate, the package layer encapsulating a portion of the at least one photosensitive chip and exposing the whole upper surface of the at least one protection layer.

4. The manufacturing method as recited in claim 3, wherein the number of the at least one photosensitive chip is plural, after the step of forming the package layer on the substrate, the package layer and the substrate are cut to form a plurality of photosensitive assemblies, and during the step of cutting the package layer and the substrate, the at least one protection layer covers the at least one active area.

5. The manufacturing method as recited in claim 3, further comprising: arranging a lens assembly on the package layer after the step of removing the at least one protection layer, the lens assembly corresponding to the at least one active area.

6. The manufacturing method as recited in claim 3, further comprising: performing a cleaning process after the step of removing the at least one protection layer.

7. The manufacturing method as recited in claim 1, further comprising: performing a fourth manufacturing process, wherein the fourth manufacturing process comprises one of a step of cleaning a surface of the substrate with use of plasma, and a step of forming a package layer on the substrate.

8. The manufacturing method as recited in claim 1, further comprising: arranging a mirror holder on the substrate after the step of removing the at least one protection layer, wherein the mirror holder exposes the at least one active area.

9. The manufacturing method as recited in claim 8, further comprising: arranging a lens assembly on the mirror holder, the lens assembly corresponding to the at least one active area.

10. The manufacturing method as recited in claim 1, further comprising: adhering a plurality of passive devices to a surface of the substrate before the step of covering the at least one active area with the at least one protection layer.

* * * * *